United States Patent
Oya

(10) Patent No.: US 8,624,608 B2
(45) Date of Patent: Jan. 7, 2014

(54) CAPACITANCE DETECTING DEVICE

(75) Inventor: Junichiro Oya, Miyagi-ken (JP)

(73) Assignee: Alps Electric Co., Ltd., Tokyo (JP)

( * ) Notice: Subject to any disclaimer, the term of this patent is extended or adjusted under 35 U.S.C. 154(b) by 191 days.

(21) Appl. No.: 13/347,346

(22) Filed: Jan. 10, 2012

(65) Prior Publication Data

US 2012/0182028 A1 Jul. 19, 2012

(30) Foreign Application Priority Data

Jan. 13, 2011 (JP) ................................. 2011-004552

(51) Int. Cl.
*G01R 27/26* (2006.01)

(52) U.S. Cl.
USPC ............ 324/684; 324/658; 324/665; 324/669

(58) Field of Classification Search
USPC ................................................ 324/658–690
See application file for complete search history.

(56) References Cited

U.S. PATENT DOCUMENTS

| | | | |
|---|---|---|---|
| 6,949,937 B2 * | 9/2005 | Knoedgen ..................... 324/658 |
| 2001/0019273 A1 * | 9/2001 | Nonoyama et al. ........... 324/678 |
| 2008/0122457 A1 * | 5/2008 | Taguchi ......................... 324/679 |
| 2009/0051656 A1 * | 2/2009 | Saito ............................. 345/168 |
| 2010/0013502 A1 * | 1/2010 | Kuang .......................... 324/686 |

FOREIGN PATENT DOCUMENTS

JP    2007-003300    1/2007

* cited by examiner

*Primary Examiner* — Jermele M Hollington
*Assistant Examiner* — Adam Clarke
(74) *Attorney, Agent, or Firm* — Brinks Gilson & Lione

(57) ABSTRACT

In a capacitance detecting device including an offset adjustment circuit for removing offset from charge transmitted to an integrator from a charge reading mechanism, the offset adjustment circuit includes a variable capacitance element switching the number of capacitative elements connected in parallel to a charge transmission line made up of a plurality of the capacitative elements and setting the number to a predetermined capacitance value; and a capacitative element for adjustment connected in parallel to the variable capacitance element and parallel, and having a capacitance value corresponding to the minimum value of the capacitative elements constituting the variable capacitance element. Driving is controlled so that offset removal is performed only N times (M>N; M and N are natural numbers) in the capacitative element for adjustment while offset removal is repeated M times in the variable capacitance element.

3 Claims, 7 Drawing Sheets

US 8,624,608 B2

CAPACITANCE DETECTING DEVICE

CLAIM OF PRIORITY

This application claims benefit of Japanese Patent Application No. 2011-004552 filed on Jan. 13, 2011, which is hereby incorporated by reference in its entirety.

BACKGROUND

1. Field of the Disclosure

The present disclosure relates to a capacitance detecting device which performs offset adjustment in the process during which converts minute changes in capacitance detected through a capacitance-type sensor into charge, and transmits the charge to an integrator.

2. Description of the Related Art

In related art, there is a capacitance detecting device (Japanese Unexamined Patent Application Publication No. 2007-3300) which detects minute changes in capacitance through a capacitance-type sensor, converts the amount of change of the detected capacitance into charge using a charge reading mechanism, transmits the charge read by the charge reading mechanism to an integrator, and integrates the transmitted charge, thereby converting the charge into a voltage signal. A capacitance component (hereinafter referred to as "offset") other than the inherent capacitance to be detected is included in the charge read from the capacitance-type sensor by the charge reading mechanism and transmitted to the integrator. It is desirable to remove the offset in the process during which charge is transmitted to the integrator from the charge reading mechanism.

An offset adjustment circuit for charge extraction (or injection) can be provided in a line which transmits charge to the integrator from the charge reading mechanism. The offset adjustment circuit includes a variable capacitance element which has one end connected to the charge transmission line which transmits charge and can apply a driving pulse from the other end. In synchronization with an integral action (charge transmission to the integrator from the charge reading mechanism), a driving pulse is added at each integration, and the charge equivalent to the offset is extracted from the transmission charge. The resolution of the variable capacitance element included in the offset adjustment circuit is determined by the synthetic capacitance of a plurality of capacitative elements for adjustment which constitutes the variable capacitance element. The number of the capacitative elements for adjustment is selected, and the charge equivalent to the synthetic capacitance is extracted as offset in the variable capacitance element.

However, individual capacitors which constitute the variable capacitance element have a limit on realizing smaller capacitance due to restrictions of a semiconductor process. For this reason, there is also a limit on the precision of the capacitance by which the offset adjustment circuit extracts (or injects) in the variable capacitance element in one integral action, and sufficient resolution is not necessarily realizable.

SUMMARY

A capacitance detecting device includes: a capacitance element having varying capacitance depending on surrounding circumstances; a charge reading mechanism reading charges of the capacitance element; an integrator integrating the read charges transmitted from the charge reading mechanism to convert the read charges into a voltage signal; an offset adjustment circuit removing offset from the charges transmitted to the integrator from the charge reading mechanism; and a control circuit controlling the operation of the offset adjustment circuit. The offset adjustment circuit has a variable capacitance element changing the number of capacitative elements connected in parallel to a charge transmission line made up of a plurality of the capacitative elements and formed between the charge reading mechanism and the integrator, and setting the number to a predetermined capacitance value; and a capacitative element for adjustment connected in parallel to the charge transmission line together with the variable capacitance element and parallel, and having a capacitance value corresponding to the minimum value of the capacitative element constituting the variable capacitance element. The control circuit drives the variable capacitance element so that offset removal is performed in the variable capacitance element whenever charges are transmitted from the charge reading mechanism to the integrator, and drives the capacitative element for adjustment so that offset removal is performed only N times (M>N; M and N are natural numbers) in the capacitative element for adjustment while offset removal is repeated M times in the variable capacitance element.

According to this configuration, the capacitative element for adjustment is driven so that offset removal is performed only N times in the capacitative element for adjustment while offset removal is removed M times in the variable capacitance element. Thus, the resolution of $Cmin \times (N/M)$ can be realized in a pseudo manner in the offset adjustment circuit if the capacitance value of the capacitative element for adjustment is set to the minimum Cmin on a semiconductor process.

According to the invention, it is possible to provide a capacitance detecting device which can adjust offset with precision higher than the minimum of the capacitative element for adjustment.

BRIEF DESCRIPTION OF THE DRAWINGS

FIGS. 3A to 3H are views showing a comparative example when offset adjustment is performed only by a variable capacitance element;

DESCRIPTION OF THE EXEMPLARY EMBODIMENTS

Figure 1:
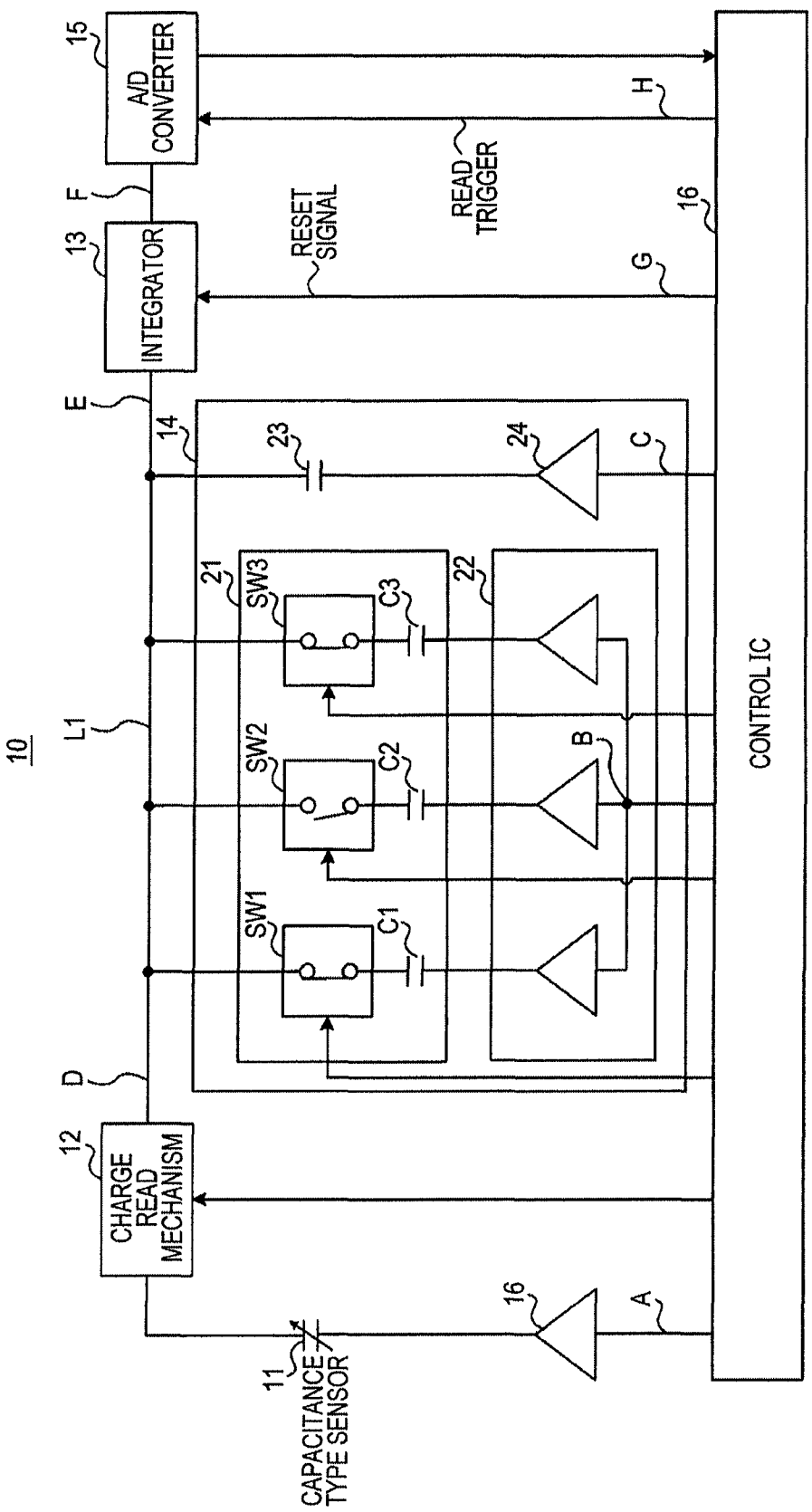
FIG. 1 is a schematic view of a capacitance detecting device related to an embodiment of the invention.

Hereinafter, an embodiment of the invention will be described in detail with reference to the accompanying drawings. FIG. 1 is a schematic view of a capacitance detecting device related to the embodiment of the invention. The capacitance detecting device 10 related to this embodiment includes a charge reading mechanism 12 which reads the capacitance (charge) detected through a capacitance-type sensor 11, an integrator 13 which integrates the charge read by the charge reading mechanism 12 to convert the charge into a voltage signal, an offset adjustment circuit 14 which removes offset from the charge transmitted to the integrator 13 from the charge reading mechanism 12, an A/D converter 15 which converts the voltage signal output from the integrator 13 into a digital signal, and a control circuit 16 which controls the operation of the overall device including offset adjustment.

In the capacitance-type sensor 11, the capacitance thereof changes depending on the circumstances around a sensor electrode which constitutes a sensor capacitor Cs. For example, when the capacitance-type sensor 11 is applied to a sensor for a touch panel, the capacitance thereof changes according to the approach of an operator's finger.

The offset adjustment circuit 14 includes a variable capacitance element 21 which connects capacitative elements C1, C2, and C3 for the adjustment of a minimum capacitor Cmin in parallel, switches SW1, SW2, and SW3 that independently perform switching ON and OFF between one end of each of the capacitative elements C1, C2, and C3 for adjustment and a charge transmission line L1, a pulse generation source 22 which applies a driving pulse in parallel to the other end of each of the capacitative elements C1, C2, and C3 for adjustment which constitutes the variable capacitance element 21, one capacitative element 23 for adjustment made up of the minimum capacitor Cmin connected in parallel to the variable capacitance element 21, and a pulse generation source 24 which applies a driving pulse to the capacitative element 23 for adjustment. The capacitative elements C1, C2, and C3 for adjustment and the capacitative element 23 for adjustment which constitutes the offset adjustment circuit 14 are formed in the same integrated circuit. The minimum capacitor Cmin may be a minimum capacitor which can be realized in consideration of restrictions on a semiconductor process.

The control circuit 16 continuously transmits the charge read by the charge reading mechanism 12 to the integrator 13 M times, and activates a reset signal only N times per M times to reset the integrator 13. At this time, the control circuit 16 controls the pulse generation source 22 so that a driving pulse is applied to the variable capacitance element 21 for each integration in synchronization with charge transmission to the integrator 13 from the charge reading mechanism 12, and controls the pulse generation source 24 so that a driving pulse is applied to the capacitative element 23 for adjustment N times (N times is from 0 time to (M−1) times) in the process of M continuous integration. M>N is satisfied, and M and N are natural numbers. Although extraction (or injection) is performed each time (M times) with a capacitance value set in the variable capacitance element 21 in the M continuous integrations (charge transmission), the minimum capacitor Cmin of the capacitative element 23 for adjustment is performed so that extraction (or injection) is performed N times. This causes the minimum capacitor Cmin to perform offset adjustment with a capacitance value of N/M in a pseudo manner. For example, if M=16, N=1, a driving pulse is generated for the capacitative element 23 for adjustment only once during sixteen continuous integral actions (sixteen driving pulses are generated for the variable capacitance element 21). If the minimum capacitor Cmin=100 fF, this is equivalent to obtaining a resolution of 100 fF×1/16=6.25 fF.

Next, the operation of this embodiment configured as above will be described.

Figure 2A:
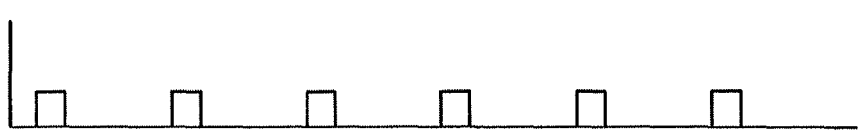
FIGS. 2A to 2H are timing charts when the number of continuous integrations M is set to M=5 in the embodiment.
Figure 2B:
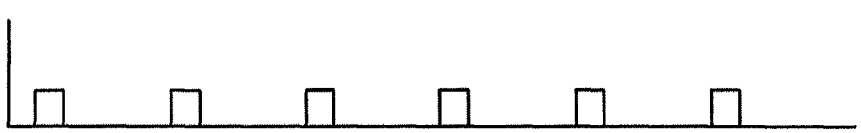
Figure 2C:
Figure 2D:
Figure 2E:
Figure 2F:
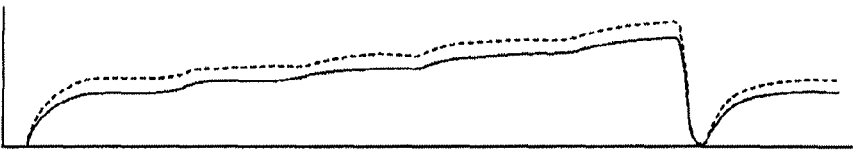
Figure 2G:
Figure 2H:
Figure 3A:
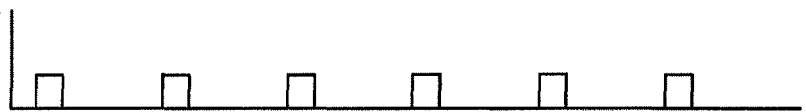
Figure 3B:
Figure 3D:
Figure 3E:
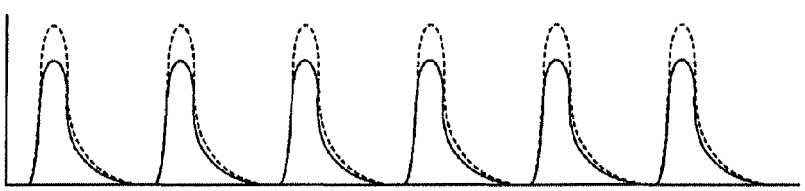
Figure 3F:
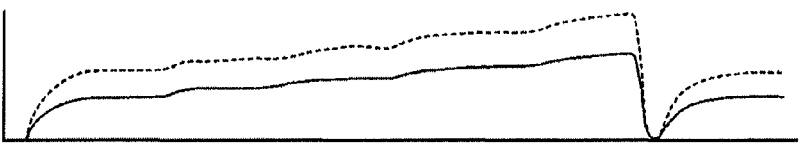
Figure 3G:
Figure 3H:

FIGS. 2A and 2H show timing charts when the number of continuous integrations M is set to M=5. The control circuit 16 supplies a timing signal (A: FIG. 2A) in a predetermined cycle to the pulse generation source 22 which generates a driving pulse for the capacitance-type sensor 11, and also supplies a control signal for charge transmission to the charge reading mechanism 12. At this time, a timing signal (B: FIG. 2B) is supplied to the pulse generation source 22 of the variable capacitance element 21 at the same timing as the timing signal (A). After five driving pulses are supplied, a read trigger (H: FIG. 2H) is applied to the A/D converter 15. After the A/D converter 15 reads the integration output of integrator 13, a reset signal (G: FIG. 2G) is supplied to the integrator 13. Then, the control circuit 16 supplies a timing signal (C: FIG. 2C) to the pulse generation source 24 of the capacitative element 23 for adjustment only once in five continuous integration.

As shown in FIGS. 2A to 2H, the charge reading mechanism 12 transmits charge in synchronization with the timing signal (A) (D: FIG. 2D), and a timing signal B is applied to the pulse generation source 22 of the variable capacitance element 21 in synchronization with the charge transmission. Thus, charge is extracted or injected to a capacitative element for adjustment connected to the charge transmission line L1 via a turned-on switch (SW1 to SW3) among the capacitative elements C1 to C3 for adjustment which constitute the variable capacitance element 21 at each charge transmission (at each integration). The second to fifth waveforms in FIG. 2E (E in FIG. 1) are equivalent to the charge extracted only by the variable capacitance element 21. In the example shown in FIG. 2, a driving pulse is applied to the capacitative element 23 for adjustment by a timing signal (C), whereby the minimum capacitor Cmin is extracted to the transmission charge provided for first integration among five continuous integrations. This realizes the resolution of Cmin/5 in a pseudo manner in the offset adjustment circuit 14. The broken line portion shown in FIG. 2E shows an offset error which slightly remains even depending on the resolution of Cmin/5.

The integrator 13 integrates the transmission charge whose offset is adjusted with the resolution of Cmin/5, and outputs an integration value as a voltage signal (F: FIG. 2F). The offset error is slightly included in the voltage signal (F) as shown by a broken line. The A/D converter 15 incorporates the voltage signal (F) which is a fifth integration value of the integrator 13, converts the voltage signal into a digital signal, and outputs the digital signal to a processing circuit (not shown) in a subsequent stage.

FIGS. 3A to 3H are views showing a comparative example when offset adjustment is performed only by the variable capacitance element 21. FIGS. 3A, 3B, and 3D to 3H correspond to the signal waveforms of FIGS. 2A, 2B, and 2D to 2H.

As shown in these drawings, since a resolution higher than that of the minimum capacitor Cmin is not obtained when offset adjustment is performed only by the variable capacitance element 21, whenever charge is extracted by the variable capacitance element 21 from the transmission charge, an offset error is caused. This offset error is accumulated at each integration until the integrator 13 is reset, and a large offset error is caused in a voltage signal (F: FIG. 2F) which is a fifth integration value of the integrator 13.

As described above, according to this embodiment, in the offset adjustment circuit 14, the capacitative element 23 for adjustment made up of the minimum capacitor Cmin is provided in parallel with the variable capacitance element 21, and charge is extracted in synchronization with all the integral actions among the M number of times of integration in the variable capacitance element 21. In the capacitative element 23 for adjustment, however, the extraction of charge in the minimum capacitor Cmin is extracted only N times (M>N) among the M number of times of integration. Thus, the resolution of Cmin×(N/M) can be realized in a pseudo manner in the offset adjustment circuit 14.

Next, the detailed configuration of a capacitance detecting device adapted to a self-capacitance type or mutual capacitance-type capacitance sensor will be described. The self-capacitance type capacitance sensor has a self-capacitance (the capacitance between a sensor electrode and GND) as a target to be detected. The mutual capacitance-type capacitance sensor has, as a target to be detected, the mutual capacitance formed between two sensor electrodes, or the capacitance defined as a difference in mutual capacitance formed between a reference electrode and two sensor electrodes.

Figure 4:
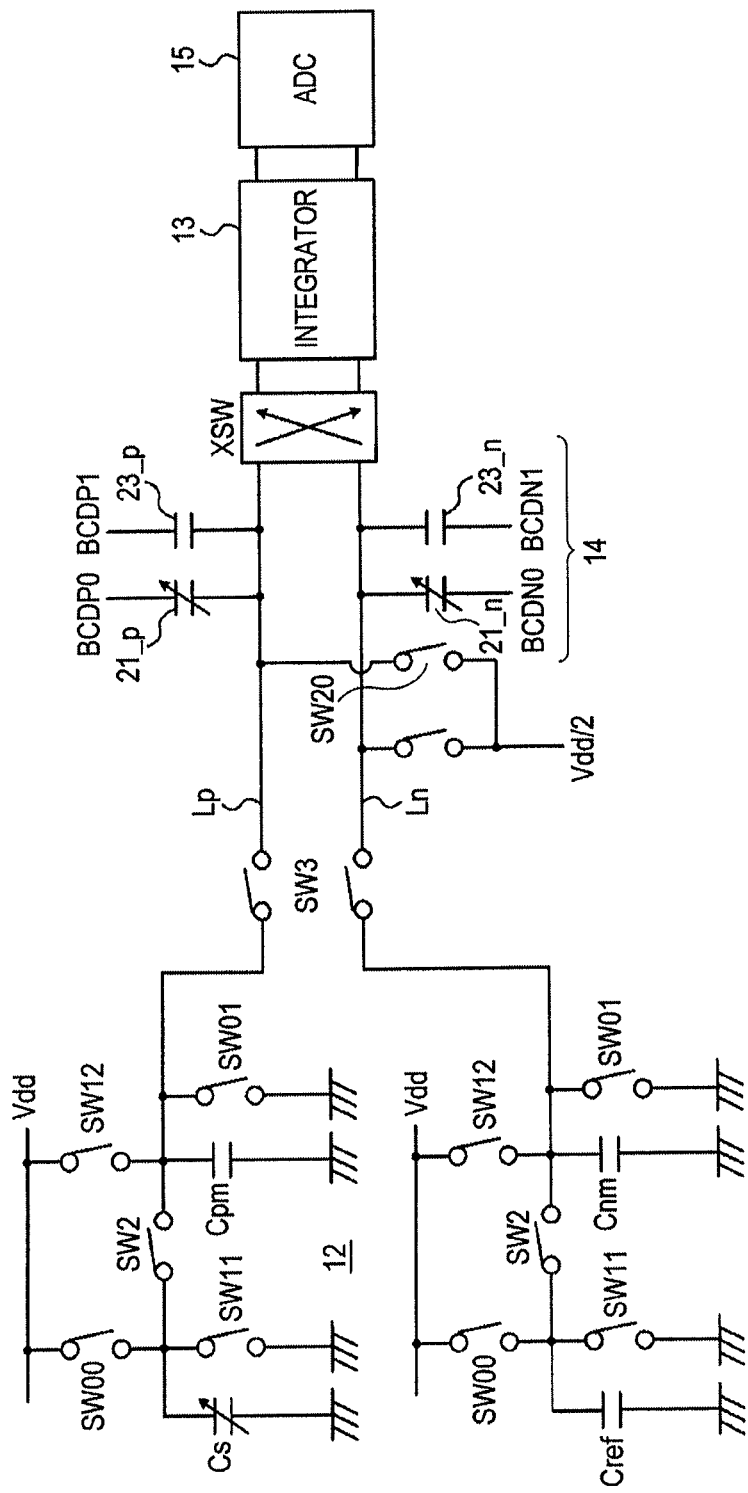
FIG. 4 is a detailed block diagram of a capacitance detecting device adapted to a self-capacitance type capacitance sensor.

FIG. 4 is a detailed block diagram of a capacitance detecting device adapted to the self-capacitance type capacitance sensor. The basic configuration of the device is the same as that of the capacitance detecting device shown in FIG. 1, and the charge reading mechanism 12 has a circuit configuration adapted to the self-capacitance type capacitance sensor.

The self-capacitance type capacitance sensor is constituted by a sensor capacitor Cs which detects a capacitance change, and a reference capacitor Cref which is a fixed capacitor. In the case of the self-capacitance type, one end of the sensor capacitor Cs and one end of the reference capacitor Cref are connected to the ground. The other end of sensor capacitor Cs and the other end of the reference capacitor Cref can be charged with voltages Vdd via switches SW00, respectively, and the sensor capacitor Cs and the reference capacitor Cref are reset by switches SW11, respectively. The sensor capacitor Cs and the reference capacitor Cref are connected to one end of redistribution capacitors Cpm and Cnm within the charge reading mechanism 12 via switches SW2, respectively. The redistribution capacitors Cpm and Cnm are configured so as to be capable of being charged with the voltages Vdd via the switches SW12, respectively, and are configured so as to be capable of being reset by switches SW01, respectively. The redistribution capacitors Cpm and Cnm are connected to input ends of a crossing switch XSW via a switch SW3. A variable capacitance element 21_p and an adjusting capacitor 23_p in the offset adjustment circuit 14 are connected in parallel to one input end of the crossing switch XSW. Additionally, a variable capacitance element 21_n and an adjusting capacitor 23_n in the offset adjustment circuit 14 are connected in parallel to the other input end of the crossing switch XSW. Although the offset adjustment circuit 14 is basically the same as the circuit configuration shown in FIG. 1, an offset adjustment circuit corresponding to the polarity of both charge transmission lines Lp and Ln is provided in correspondence with a differential circuit configuration. In addition, a voltage Vdd/2 is applied to the charge transmission lines Lp and Ln via a switch SW20. The integrator 13 is connected to output ends of the crossing switch XSW.

Figure 5:
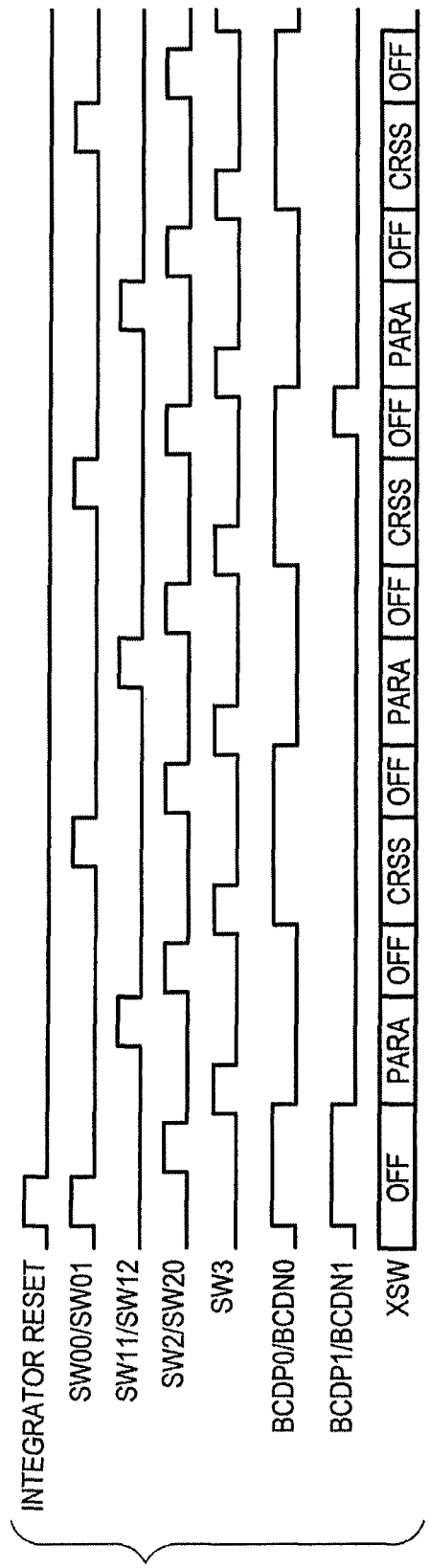
FIG. 5 is a timing chart of the capacitance detecting device shown in FIG. 4.

FIG. 5 is a timing chart of the above capacitance detecting device. In this drawing, charge extraction (injection on the negative polarity side) in the minimum capacitor Cmin using the adjusting capacitor 23_p/23_n is performed at a rate of once per four integrations. In addition, charge extraction (injection on the negative polarity side) using the variable capacitance element 21_p/21_n is performed at each integration.

Simultaneously when the integrator 13 is reset, the switches SW00/SW01 are turned on, whereby the sensor capacitor Cs and the reference capacitor Cref are charged with the voltages Vdd and the redistribution capacitors Cpm and Cnm are reset. After the switches SW00/SW01 are turned off, the switches SW2/SW20 are turned on. The switches SW2 are turned on, whereby the charge of the sensor capacitor Cs is distributed to the redistribution capacitor Cpm, and the charge of the reference capacitor Cref is distributed to the redistribution capacitor Cnm. Additionally, fixed voltages Vdd/2 are applied to the charge transmission lines Lp and Ln by turning on the switch SW20. The switch SW3 is turned on at the timing which the switches SW2/SW20 are turned off, thereby connecting the redistribution capacitors Cpm and Cnm with the integrator 13, and lowering driving pulses BCDP0/BCDN0 and BCDP1/BCDN1 in a high-level state until then. A falling pulse when the driving pulse BCDP0/BCDN0 is lowered becomes a driving pulse to be applied to the variable capacitance element 21_p/21_n, and a falling pulse when the driving pulse BCDP1/BCDN1 is lowered becomes a driving pulse to be applied to the adjusting capacitor 23_p/23_n. The crossing switch XSW is set to parallel connection at the timing which the switch SW3 is turned on. As a result, the charge of the redistribution capacitor Cpm to which the charge on the sensor capacitor Cs is distributed is input via the charge transmission line Lp to one input terminal (positive electrode side) of the integrator 13. Additionally, the charge of the redistribution capacitor Cnm to which the charge on the reference capacitor Cref side is distributed is input via the charge transmission line Ln to the other input terminal (negative electrode side) of the integrator 13. At this time, since driving pulses are provided to both the variable capacitance element 21_p/21_n and the adjusting capacitor 23_p/23_n, extraction (or injection) of charge is performed in each of the variable capacitance element 21_p/21_n and the adjusting capacitor 23_p/23_n.

Next, after the switch SW3 is turned off, the switches SW11/SW12 are turned on. The sensor capacitor Cs and the reference capacitor Cref are reset by turning on the switches SW11, and the redistribution capacitors Cpm and Cnm are charged with the voltages Vdd by turning on the switches SW12. After the switches SW11/SW12 are turned off, the switches SW2/SW20 are turned on. By turning on the switches SW2, redistribution of charge is performed between the redistribution capacitors Cpm and Cnm charged with the voltages Vdd, and the reset sensor capacitor Cs and reference capacitor Cref. After the switches SW2 are turned off, the switch SW3 is turned on, and only the driving pulse BCDP0/BCDN0 is raised. By turning on the switch SW3, the charge of the redistribution capacitors Cpm and Cnm is transmitted to the integrator 13 with the polarity reversed to the previous time via the crossing switch XSW set in a crossing state. At this time, a rising pulse when the driving pulse BCDP0/BCDN0 is raised becomes a driving pulse to be applied to the variable capacitance element 21_p/21_n, and offset adjustment (extraction/injection of charge) using only the variable capacitance element 21_p/21_n is performed. Below, integration is similarly repeated 3 times and 4 times at the rising/falling edge of the driving pulse BCDP0/BCDN0, and offset adjustment only using the variable capacitance element 21_p/21_n is performed at each time. Then, at fifth integration as counted from the beginning, the driving pulse BCDP0/BCDN0 and BCDP1/BCDN1 are simultaneously lowered. Thereby, charge extraction/injection using the variable capacitance element 21_p/21_n is performed with a driving pulse generated at a falling edge of the driving pulse BCDP0/BCDN0, and extraction/injection of charge is performed in the adjusting capacitor 23_p/23_n with a driving pulse generated at a falling edge of BCDP1/BCDN1.

As described above, since extraction/injection of charge in the minimum capacitor Cmin using the adjusting capacitor 23_p/23_n is performed at a rate of once per four integrations, the resolution of Cmin×(1/5) can be realized in a pseudo manner in the offset adjustment circuit 14.

Figure 6:
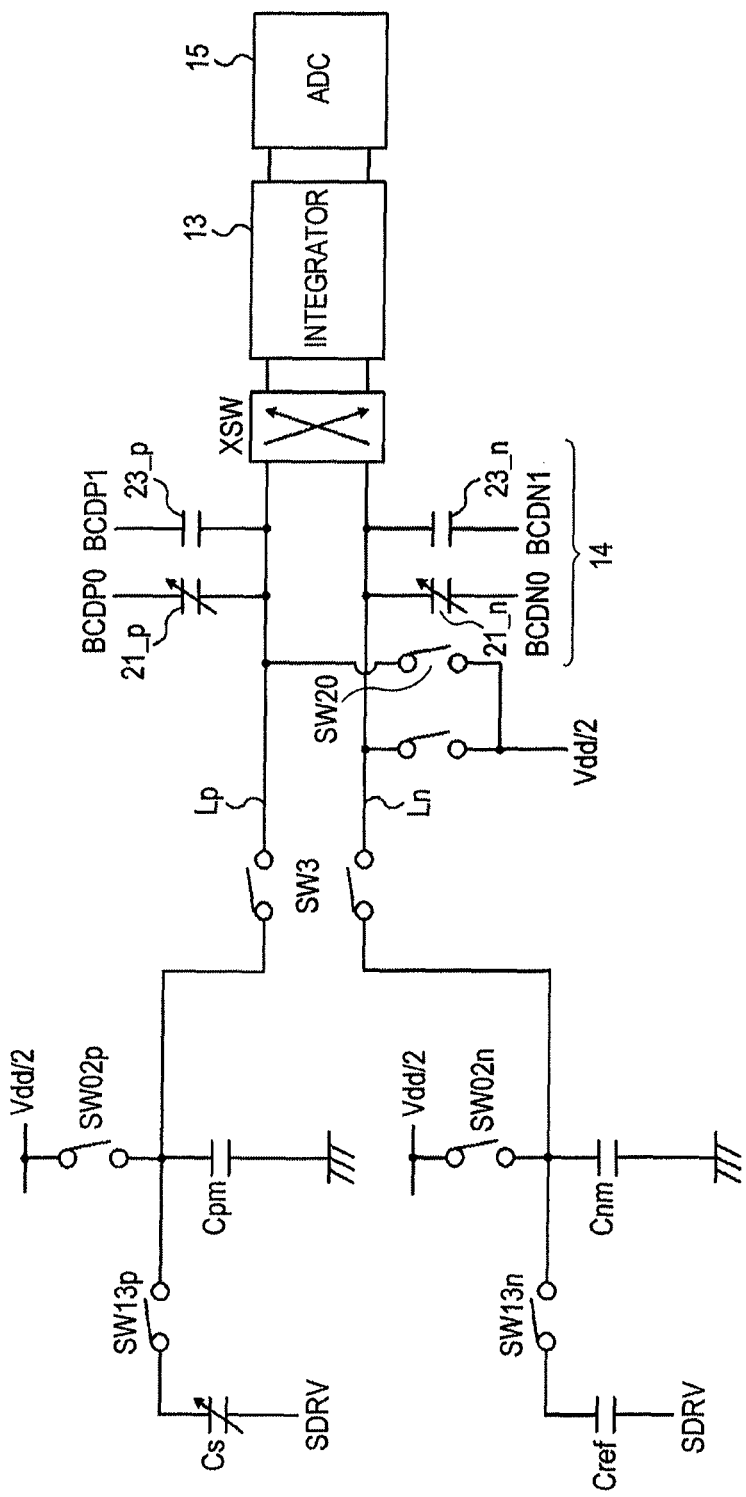
FIG. 6 is a detailed block diagram of a capacitance detecting device adapted to a mutual capacitance-type capacitance sensor.

FIG. 6 shows the detailed block of a capacitance detecting device adapted to the mutual capacitance-type capacitance sensor. The basic configuration of the device is the same as that of the capacitance detecting device shown in FIG. 1, and the charge reading mechanism 12 has a circuit configuration adapted to the mutual capacitance-type capacitance sensor.

The mutual capacitance-type capacitance sensor is constituted by a sensor capacitor Cs which detects a capacitance change, and a reference capacitor Cref which is a fixed capacitor. In the case of the mutual capacitance-type, one end of the sensor capacitor Cs and one end of the reference capacitor Cref become supply voltage Vdd/2 sides, and driving pulses SDRV are configured to be capable of being supplied to the other ends of the sensor capacitor and the reference capacitor. The sensor capacitor Cs and the redistribution capacitor Cpm are connected together a switch SW13$p$, and the reference capacitor Cref and the redistribution capacitor Cnm are connected together by a switch SW13$n$. A voltage Vdd/2 is applied via switches SW02$p$ and SW13$p$ to one terminal of the sensor capacitor Cs. Additionally, a voltage Vdd/2 is applied via switches SW02$n$ and SW13$n$ to one terminal of the reference capacitor Cref. The other configuration is the same as that of the capacitance detecting device shown in FIG. 4.

Figure 7:
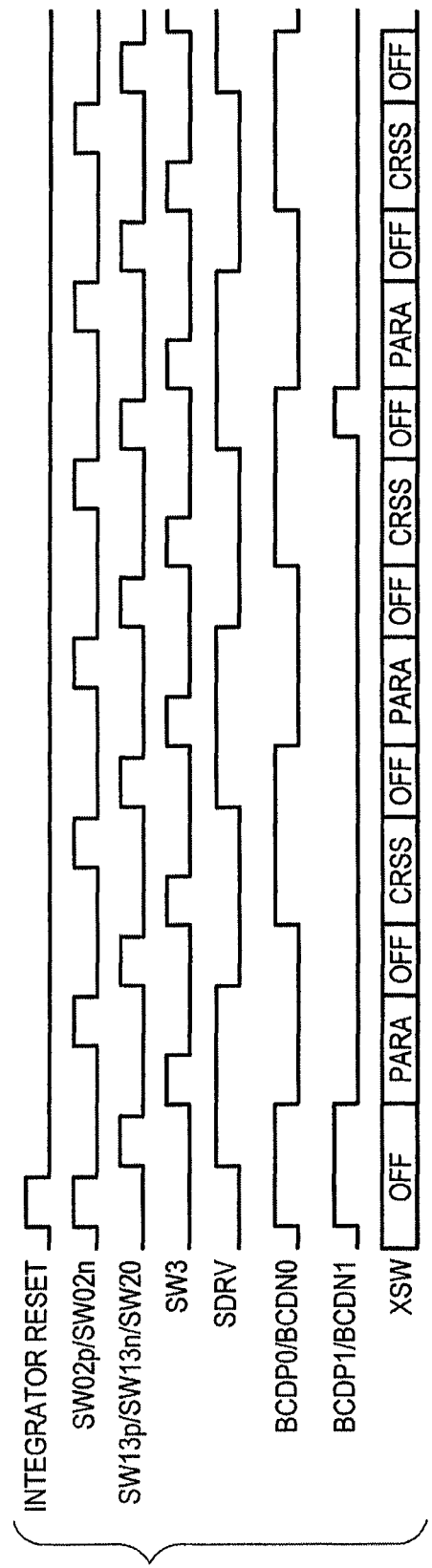
FIG. 7 is a timing chart of the capacitance detecting device shown in FIG. 6.

FIG. 7 is a timing chart of the above capacitance detecting device. In this drawing, charge extraction (injection on the negative polarity side) at the minimum capacitor Cmin using the adjusting capacitor 23_$p$/23_$n$ is performed at a rate of once per four integrations. In addition, charge extraction (injection on the negative polarity side) using the variable capacitance element 21_$p$/21_$n$ is performed at each integration.

Simultaneously when the integrator 13 is reset, the switch SW02$p$/SW02$n$ is turned on, whereby the redistribution capacitors Cpm and Cnm are charged with the voltages Vdd/2. Thereafter, in synchronization with turning off the switch SW02$p$/SW02$n$, switches SW13$p$, and 13$n$ and 20 are turned on, and the driving pulses SDRV are raised. The charge corresponding to the capacitance of the sensor capacitor Cs and the capacitance of the reference capacitor Cref is distributed to the redistribution capacitors Cpm and Cnm at the rising edges of the driving pulses SDRV. Next, if the switches SW13$p$, 13$n$ and 20 are turned off, the switch SW3 is turned on, and the driving pulses BCDP0/BCDN0 and BCDP1/BCDN1 which are maintained at a high level until then are lowered. The falling edge of the driving pulse BCDP0/BCDN0 becomes a driving pulse to be applied to the variable capacitance element 21_$p$/21_$n$, and a falling edge of the driving pulse BCDP1/BCDN1 becomes a driving pulse to be applied to the adjusting capacitor 23_$p$/23_$n$. The crossing switch XSW is set to parallel connection at the timing which the switch SW3 is turned on. As a result, the charge of the redistribution capacitor Cpm to which the charge on the sensor capacitor Cs is distributed is input via the charge transmission line Lp to one input terminal (positive electrode side) of the integrator 13. Additionally, the charge of the redistribution capacitor Cnm to which the charge on the reference capacitor Cref side is distributed is input via the charge transmission line Ln to the other input terminal (negative electrode side) of the integrator 13. At this time, since driving pulses are provided to both the variable capacitance element 21_$p$/21_$n$ and the adjusting capacitor 23_$p$/23_$n$, extraction (or injection) of charge is performed in each of the variable capacitance element 21_$p$/21_$n$ and the adjusting capacitor 23_$p$/23_$n$.

Next, when the switches SW02$p$ and SW02$n$ are turned on again, the redistribution capacitors Cpm and Cnm are charged with the voltages Vdd/2. Thereafter, in synchronization with turning off the switch SW02$p$/SW02$n$, switches SW13$p$, and 13$n$ and 20 are turned on, and the driving pulses SDRV are lowered. The charge corresponding to the capacitance of the sensor capacitor Cs and the capacitance of the reference capacitor Cref is distributed to the redistribution capacitors Cpm and Cnm at the falling edges of the driving pulses SDRV. Next, if the switches SW13$p$, 13$n$ and 20 are turned off, the switch SW3 is turned on, and the driving pulse BCDP0/BCDN0 which are maintained at a low level until subsequently raised. The rising edge of the driving pulse BCDP0/BCDN0 becomes a driving pulse given to the variable capacitance element 21_$p$/21_$n$. Since the driving pulse BCDP1/BCDN1 is not changed, the adjusting capacitor 23_$p$/23_$n$ is not driven. The crossing switch XSW is set to cross connection at the timing which the switch SW3 is turned on. As a result, the charge of the redistribution capacitor Cpm to which the charge the sensor capacitor Cs side is distributed is input to the other input terminal (negative electrode side) of the integrator 13, and the charge of the redistribution capacitor Cnm to which the charge on the reference capacitor Cref side is distributed is input to one input terminal (positive electrode side) of the integrator 13. At this time, since a driving pulse is given only to the variable capacitance element 21_$p$/21_$n$, extraction (or injection) of the charge only using the variable capacitance element 21_$p$/21_$n$ is performed. Below, integration is similarly repeated 3 times and 4 times at a rising/falling edge of the driving pulse BCDP0/BCDN0, and offset adjustment only using the variable capacitance element 21_$p$/21_$n$ is performed at each time. Then, at fifth integration as counted from the beginning, the driving pulse BCDP0/BCDN0 and BCDP1/BCDN1 are simultaneously lowered. Thereby, charge extraction/injection using the variable capacitance element 21_$p$/21_$n$ is performed with a driving pulse generated at a falling edge of the driving pulse BCDP0/BCDN0, and extraction/injection of charge is performed in the adjusting capacitor 23_$p$/23_$n$ with a driving pulse generated at a falling edge of BCDP1/BCDN1.

As described above, since extraction/injection of charge in the minimum capacitor Cmin using the adjusting capacitor 23_$p$/23_$n$ is performed at a rate of once per four integrations, the resolution of Cmin×(1/5) can be realized in a pseudo manner in the offset adjustment circuit 14.

In addition, the invention is not limited to the above embodiment, and various modifications thereof can be made. In the above embodiment, the circuit configuration shown in the accompanying drawings is not limited thereto, and the invention can be appropriately changed within a range in which the effects of the invention are exhibited. In addition, the invention can be appropriately changed without departing the purpose thereof.

The invention can be applied to capacitance detecting devices of capacitance sensors, such as a touch sensor.

It should be understood by those skilled in the art that various modifications, combinations, sub-combinations and alterations may occur depending on design requirements and other factors insofar as they are within the scope of the appended claims of the equivalents thereof.

What is claimed is:
1. A capacitance detecting device comprising:
a capacitance element having varying capacitance depending on surrounding circumstances;
a charge reading mechanism reading the charge of the capacitance element;
an integrator integrating the read charge transmitted from the charge reading mechanism to convert the read charge into a voltage signal;

an offset adjustment circuit removing offset from the charge transmitted to the integrator from the charge reading mechanism; and a control circuit controlling the operation of the offset adjustment circuit, wherein the offset adjustment circuit includes:

a variable capacitance element switching the number of capacitative elements connected in parallel to a charge transmission line made up of a plurality of the capacitative elements and formed between the charge reading mechanism and the integrator, and setting the number to a predetermined capacitance value; and a capacitative element for adjustment that is connected in parallel to the variable capacitance element with respect to the charge transmission line, and having a capacitance value corresponding to the minimum value of the capacitative elements constituting the variable capacitance element, wherein the control circuit drives the variable capacitance element so that offset removal is performed in the variable capacitance element whenever charge is transmitted from the charge reading mechanism to the integrator, and drives the capacitative element for adjustment so that offset removal is performed only N times (M>N; M and N are natural numbers) in the capacitative element for adjustment while offset removal is repeated M times in the variable capacitance element.

2. The capacitance detecting device according to claim 1, wherein the variable capacitance element and the capacitative element for adjustment are formed in one integrated circuit.

3. The capacitance detecting device according to claim 1, wherein the number of times M of driving of the variable capacitance element, and number of times N of driving of the capacitative element for adjustment are determined so that an offset error caused by the variable capacitance element is absorbed in advance in the capacitative element for adjustment.

* * * * *